US009698656B2

(12) United States Patent
Yamada et al.

(10) Patent No.: US 9,698,656 B2
(45) Date of Patent: Jul. 4, 2017

(54) MOTOR INCORPORATING POWER CONVERTER, AND AIR CONDITIONER, WATER HEATER, AND VENTILATION BLOWER INCORPORATING THE MOTOR

(75) Inventors: Michio Yamada, Tokyo (JP); Junichiro Oya, Tokyo (JP); Hiroki Aso, Tokyo (JP); Hiroyuki Ishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 61 days.

(21) Appl. No.: 14/362,972

(22) PCT Filed: Dec. 13, 2011

(86) PCT No.: PCT/JP2011/078808
§ 371 (c)(1),
(2), (4) Date: Jun. 5, 2014

(87) PCT Pub. No.: WO2013/088518
PCT Pub. Date: Jun. 20, 2013

(65) Prior Publication Data
US 2014/0311716 A1    Oct. 23, 2014

(51) Int. Cl.
*H02P 6/00* (2016.01)
*H02K 11/00* (2016.01)
(Continued)

(52) U.S. Cl.
CPC .......... *H02K 11/0073* (2013.01); *H02K 5/04* (2013.01); *H02K 5/08* (2013.01); *H02K 11/0094* (2013.01);
(Continued)

(58) Field of Classification Search
USPC .................... 318/822, 722, 700, 800, 400.08
See application file for complete search history.

(56) References Cited

U.S. PATENT DOCUMENTS

| 5,327,064 A | 7/1994 | Arakawa et al. |
| 7,643,296 B2 | 1/2010 | Yamada et al. |
| 2013/0175012 A1 | 7/2013 | Yamada et al. |

FOREIGN PATENT DOCUMENTS

| EP | 1 844 965 A1 | 10/2007 |
| EP | 1 909 377 A1 | 4/2008 |

(Continued)

OTHER PUBLICATIONS

Office Action mailed Sep. 16, 2014 issued in corresponding JP patent application No. 2013-548993 (and partial English translation).

(Continued)

*Primary Examiner* — Eduardo Colon Santana
*Assistant Examiner* — Iftekhar Mustafa
(74) *Attorney, Agent, or Firm* — Posz Law Group, PLC

(57) ABSTRACT

A motor incorporating a power converter that includes a printed board on which an inverter IC, which converts a voltage of an external power supply into a high-frequency voltage and supplies the high-frequency voltage to a stator, is mounted, wherein on a surface of the printed board opposed to the stator, a high-voltage direct-current input wire, which is a copper foil provided on a surface on a stator side, is disposed. One end of the high-voltage direct-current input wire is electrically connected to a high-voltage input line of the external power supply and the other end of the high-voltage direct-current input wire is electrically connected to a high-voltage electrode of the inverter IC.

13 Claims, 6 Drawing Sheets

(51) Int. Cl.
*H02K 5/04* (2006.01)
*H02K 5/08* (2006.01)
*H02K 11/215* (2016.01)
*H02K 11/33* (2016.01)
*H02P 27/06* (2006.01)
*F24F 11/00* (2006.01)
*H02K 15/12* (2006.01)
*H02M 7/00* (2006.01)

(52) U.S. Cl.
CPC ........ *H02K 11/215* (2016.01); *H02K 11/33* (2016.01); *F24F 2011/0083* (2013.01); *H02K 15/12* (2013.01); *H02M 7/003* (2013.01); *H02P 27/06* (2013.01)

(56) References Cited

FOREIGN PATENT DOCUMENTS

| JP | 04-067759 | A | | 3/1992 | |
|----|-----------|---|---|--------|---|
| JP | 05-091708 | A | | 4/1993 | |
| JP | 09-135058 | A | | 5/1997 | |
| JP | 10-201280 | A | | 7/1998 | |
| JP | 2002-319746 | A | | 10/2002 | |
| JP | 2002-335649 | A | | 11/2002 | |
| JP | 2004-153944 | A | | 5/2004 | |
| JP | 2005-253165 | A | | 9/2005 | |
| JP | 2006-129568 | A | | 5/2006 | |
| JP | 2008-187798 | A | | 8/2008 | |
| JP | 2009219268 | A | * | 9/2009 | ............ H02M 7/003 |
| JP | 2010183797 | A | * | 8/2010 | ............ H02K 11/00 |
| JP | 2011-050247 | A | | 3/2011 | |
| JP | 2011-061907 | A | | 3/2011 | |
| JP | 2011050247 | A | * | 3/2011 | |
| WO | 2007/080748 | A1 | | 7/2007 | |

OTHER PUBLICATIONS

International Search Report of the International Searching Authority mailed Jan. 31, 2012 for the corresponding international application No. PCT/JP2011/078808 (with English translation).

Extended European Search Report dated Oct. 15, 2015 issued in corresponding EP patent application No. 11877226.8.

Communication pursuant to Article 94(3) EPC issued on Sep. 26, 2016 in corresponding EP patent application No. 11 877 226.8.

* cited by examiner

MOTOR INCORPORATING POWER CONVERTER, AND AIR CONDITIONER, WATER HEATER, AND VENTILATION BLOWER INCORPORATING THE MOTOR

CROSS REFERENCE TO RELATED APPLICATION

This application is a U.S. national stage application of International Patent Application No. PCT/JP2011/078808 filed on Dec. 13, 2011.

TECHNICAL FIELD

The present invention relates to a motor incorporating a power converter configured from a power converter circuit board using a semiconductor module, and an air conditioner, a water heater, and a ventilation blower incorporating the motor.

BACKGROUND

In recent years, a motor incorporating a driving circuit is often used in blowers for air conditioning. In the motor, a high-voltage power converter circuit and a stator are connected to each other. The motor is molded with thermosetting resin, such as unsaturated polyester resin. The direct-current power supply for motor driving is set to a voltage as high as maximum 325 volts (e.g., Patent Literature 1). Air conditioners are often used in areas where power supply situations are bad. The maximum of the voltage of the direct-current power supply tends to further increase.

A package for sealing an integrated circuit (hereinafter abbreviated as IC) has been reduced in size and a package for surface mounting is also often used. In particular, for an IC mounted on a power converter in a motor, the package for surface mounting is used in more cases because of a demand for size reduction (e.g., Patent Literature 2). However, ICs used in a blower motor for air conditioning or the like require relatively large allowable power consumption. Therefore, mounting needs to be contrived to efficiently radiate heat generated by the allowable power consumption.

Patent Literature

Patent Literature 1: Japanese Patent Application Laid-Open No. 2011-61907 (paragraph [0040], FIG. 1 and FIG. 3)
Patent Literature 2: Japanese Patent Application Laid-Open No. H5-91708 (paragraph [0011] to [0016], FIG. 2, FIG. 3, and FIG. 4)

Technical Problem

However, in the power converter disclosed in Patent Literature 1, because an IC in which main sections of the power converter circuit are integrated is a lead type, there is a problem in that an artificial process is necessary for substrate mounting. Because the arrangement position of the IC on the printed board is the counter-stator side, there is a problem in that the circuit is thick. Further, when the inverter circuit in the IC causes a vertical short-circuit failure, because the high-voltage power supply terminal of the broken IC and the substrate copper foil around the high-voltage power supply terminal are provided on the counter-stator side, it is necessary to secure a large thickness of mold resin on the counter-stator side to prevent the IC breakage from affecting the outside of the motor. Therefore, there is a problem in that the motor is increased in size.

In the power converter disclosed in Patent Literature 2 described above, because the IC is surface-mounted on the substrate and therefore the solder area cannot be secured, there is a problem in that the mechanical connection strength with the printed board decreases compared with the lead mounting. In the power converter disclosed in Patent Literature 2, because the semiconductor chip of the switching power element is directly mechanically connected to the printed board, it is necessary to use a substrate formed of metal or a sintered base material rather than a printed board formed of a resin base material for chip heat radiation. Therefore, there is a problem in that costs increase. Further, in the substrate having high heat radiation properties (the substrate formed of metal or a sintered base material), in general, wiring is laid on one surface. Therefore, there is a problem in that wiring efficiency is low and the substrate area increases compared with a double-sided substrate.

When a surface mount IC is used in a power conversion main circuit including a switching power element and heat of the IC is radiated via a copper foil on a printed board from a heat spreader arranged on an IC package, a high-voltage wire from an IC terminal cannot be arranged in the lower part of the IC and the periphery thereof. In this case, it is necessary to route part of the high-voltage wire to the counter-stator side of the printed board. However, because of the situation in which, for example, die holes for holding the substrate are arranged on the counter-stator side of the printed board, the area where the high-voltage wire can be laid is extremely narrow. Therefore, in the printed board including the copper foil only on the counter-stator side, there is a problem in that the high-voltage wire cannot be arranged in some cases.

SUMMARY

The present invention has been devised in view of the above and it is an object of the present invention to obtain a motor incorporating a power converter in which a reduction in the size of a printed board can be attained and the thickness of mold resin on the counter-stator side can be suppressed, and an air conditioner, a water heater, and a ventilation blower incorporating the motor.

In order to solve the above problems and achieve the object, the present invention is a motor incorporating a power converter that includes a substrate on which a semiconductor module, which converts a voltage of an external power supply into a high-frequency voltage and supplies the high-frequency voltage to a stator, is mounted, wherein on a surface of the substrate opposed to the stator, a high-voltage side wire is disposed, one end of which is electrically connected to a high-voltage input line of the external power supply and another end of which is electrically connected to a high-voltage electrode of the semiconductor module.

According to the present invention, because components such as a semiconductor element and a high-voltage wire are mounted on the surface on the stator side of the printed board, an effect is obtained where it is possible to attain a reduction in the size of the printed board and reduce the thickness of mold resin on the counter-stator side.

DETAILED DESCRIPTION

Embodiments of a motor incorporating a power converter, and an air conditioner, a water heater, and a ventilation blower incorporating the motor according to the present invention are explained in detail below with reference to the drawings. Note that the present invention is not limited by the embodiments.

First Embodiment (Configurations of a Power Converter 60 and a Motor 61)

Figure 1:
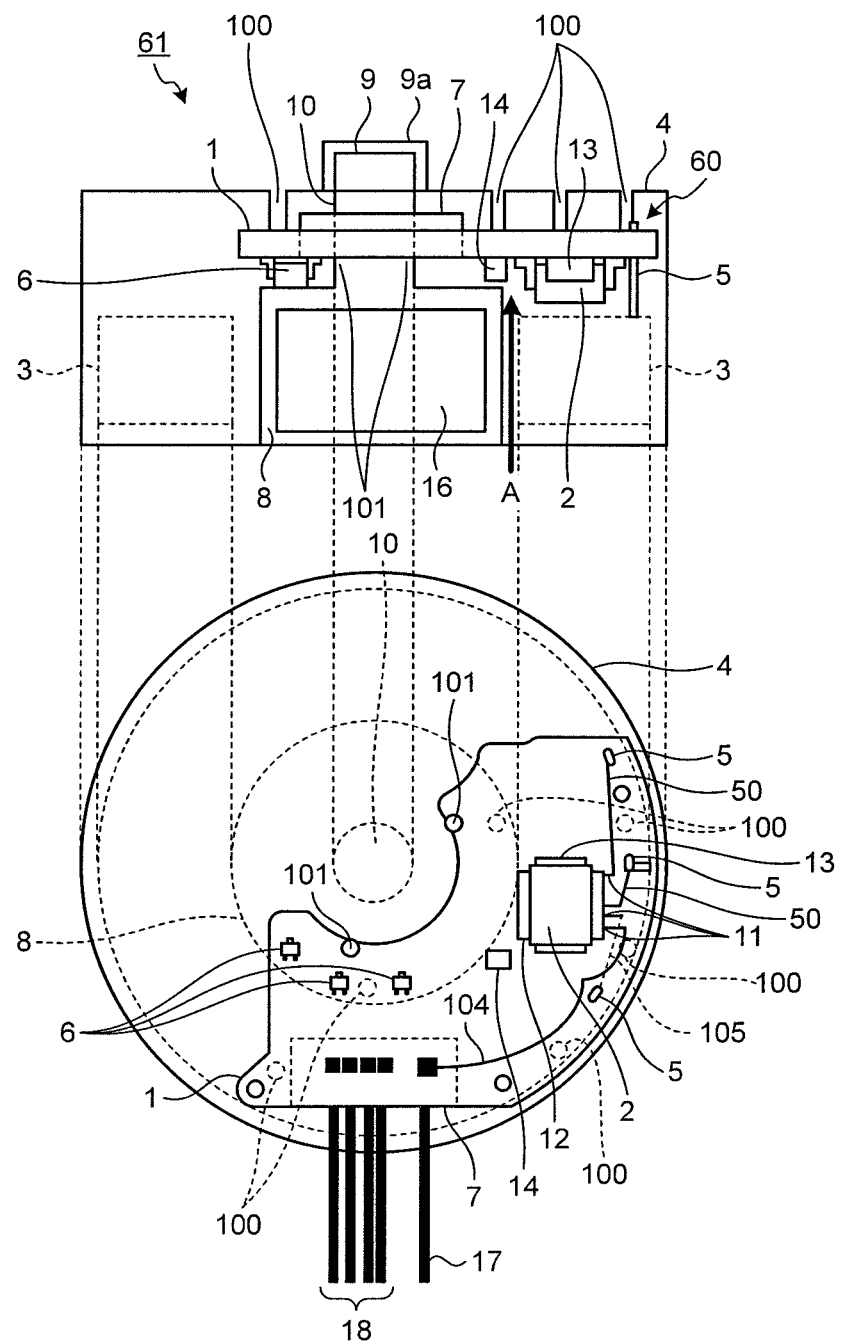
FIG. 1 is a side sectional view and a top transparent view of a motor incorporating a power converter according to a first embodiment of the present invention.

FIG. 1 is a side sectional view and a top transparent view of the motor 61 incorporating the power converter 60 according to a first embodiment of the present invention. On the lower side of FIG. 1, a surface on the stator side of a printed board 1 viewed from the direction of an arrow A in FIG. 1 is shown. The power converter 60 includes, as main components, a printed board 1 formed in a substantially semi-circular arc shape, an inverter IC 2, motor terminals 5, which are input terminals of the phases of the motor 61, hall elements 6 that detect a rotational position of a rotor 16, a motor external connection lead 7, and an overheating detecting element 14 that detects the overheating state of the inverter IC 2. The motor 61 includes, as main components, the power converter 60, a stator 3, the rotor 16, and a bearing 9.

In the motor 61, the printed board 1 on which a power converter circuit for rotationally driving the motor 61 is mounted is incorporated. The inverter IC 2, which is part of the power converter circuit, is mounted on the printed board 1. The inverter IC 2 incorporates a main circuit of a voltage type inverter for applying a voltage to a winding wire, which is a copper wire, an aluminum wire, or the like, of the stator 3 of the motor 61.

In the motor 61, the stator 3 having an annular shape, in which a winding wire is wound around a stator core (not shown), is arranged on the side of the printed board 1 on which the inverter IC 2 is mounted.

The stator 3 and the printed board 1 are mechanically connected by thermosetting mold resin 4, such as unsaturated polyester. On the counter-stator side of the printed board 1, the external shape of the motor 61 forming a bearing housing 9a is formed by the mold resin 4.

To correctly keep the positional relationship between the stator 3 and the printed board 1 in the mold resin 4, the surface on the counter-stator side of the printed board 1 is held by a die (not shown) that is in contact with the printed board 1 at the positions indicated by reference numeral 100 and the surface on the stator side of the printed board 1 is held by the stator 3 and a die that is in contact with the printed board 1 at the positions indicated by reference numeral 101. More specifically, both of the inner circumferential side and the outer circumferential side (six places with the reference numeral 100 indicated by dotted line circles) of the surface on the counter-stator side of the printed board 1 are held by the die. The surface on the stator side of the printed board 1 is mechanically connected to the stator 3 via the motor terminals 5; therefore, only the inner circumferential side (two places with the reference numeral 101 indicated by solid line circles) of the printed board 1 is held by the die. Then, resin is fed into the dies and the mold resin 4 is molded. The dies are removed after the molding of the mold resin 4. Therefore, in the places indicated by the reference numerals 100 and 101, holes from which the printed board 1 is directly exposed are formed.

The printed board 1 and the stator 3 are electrically connected by the motor terminals 5 by soldering such that a voltage is applied from the printed board 1 to the stator 3. On the surface on the stator side of the printed board 1, the hall elements 6 arranged to be surrounded by the stator 3 are mounted and the overheating detecting element 14 is set near the inverter IC 2. On the surface on the counter-stator side of the printed board 1, the motor external connection lead 7 is set to electrically connect the printed board 1 and the outside of the motor 61. A high-voltage input line 17 and a low-voltage input and output line 18 extend from the motor external connection lead 7 to the outer side.

In the inner circumferential section of the stator 3, a rotor through-hole 8 not filled with the mold resin 4 and hollowed out in a cylindrical shape is provided. In the rotor through-hole 8, the rotor 16, which is a rotor of the motor 61, is arranged. A bearing through-hole 10 is formed on the inner circumferential side of the printed board 1. The baring through-hole 10 communicates with the rotor through-hole 8 and the main shaft (not shown) of the rotor 16 pierces through the mold resin 4 to the bearing housing 9a in the direction substantially perpendicular to the printed board 1. In the bearing through-hole 10, the bearing 9 is housed. The main shaft (not shown) of the rotor 16 is provided to pierce through the inner ring (not shown) of the bearing 9.

The inverter IC 2 is configured to include, as main components, a heat spreader 13, high-voltage electrodes 11, and a low-voltage electrode 12. A plurality of (three in FIG. 1 as an example) electrodes (the high-voltage electrodes 11), which are one electrodes forming a dual inline electrode of the inverter IC 2, are provided in the inverter IC 2. A high direct-current voltage obtained by subjecting a commercial power supply to full-wave rectification or double-voltage rectification on the outside of the motor 61 is input to the high-voltage electrodes 11. In the inverter IC 2, the high direct-current voltage is converted into a high-frequency voltage. The high-voltage electrodes 11 output the high-frequency voltage to the motor terminals 5. Note that the high-voltage electrodes 11 are provided, for example, between the inverter IC 2 and the outer circumferential side of the printed board 1 as shown in FIG. 1 taking into account the setting positions of the motor terminals 5 such that a wire (a motor output wire 105) on the printed board 1 is short.

The high-voltage input line 17 is electrically connected to a high-voltage direct-current input wire 104 (high-voltage side wire), which is a copper foil provided on the surface on the stator side of the printed board 1, via the motor external connection lead 7. One end of the high-voltage direct-current input wire 104 is electrically connected to the high-voltage input line 17 by solder. The other end of the high-voltage direct-current input wire 104 is electrically connected to the high-voltage electrode 11, which is provided in the inverter IC 2, by solder. The motor output wire 105 (a chain line extending from the high-voltage electrode 11 of the inverter IC 2 to the motor terminal 5), which is a copper foil provided on the surface on the counter-stator side of the printed board 1 in proximity to the high-voltage direct-current input wire 104, is electrically connected to the motor terminal 5 on the counter-stator side by solder. Copper foils 50 (solid lines extending from the high-voltage electrodes 11 of the inverter IC 2 to the motor terminals 5) provided on the surface on the stator side of the printed board 1 in proximity to the high-voltage direct-current input wire 104 are electrically connected to the motor terminals 5 on the stator side by solder. The high-voltage electrodes 11 of the inverter IC 2 shown in FIG. 1 are provided on the outer circumferential side of the printed board 1. Therefore, the high-voltage direct-current input wire 104 is disposed along the outer circumferential side of the printed board 1 starting from a point between the inverter IC 2 and the outer circumference of the printed board 1 and are connected to the high-voltage electrode 11 of the inverter IC 2. By providing the high-voltage direct-current input wire 104 in this way, it is possible to supply high-voltage direct-current power to the inverter IC 2 without interfering with the heat spreader 13 provided in the inverter IC 2, the overheating detecting element 14 on the printed board 1, and the like.

(Configuration of the Inverter IC 2)

Figure 2:
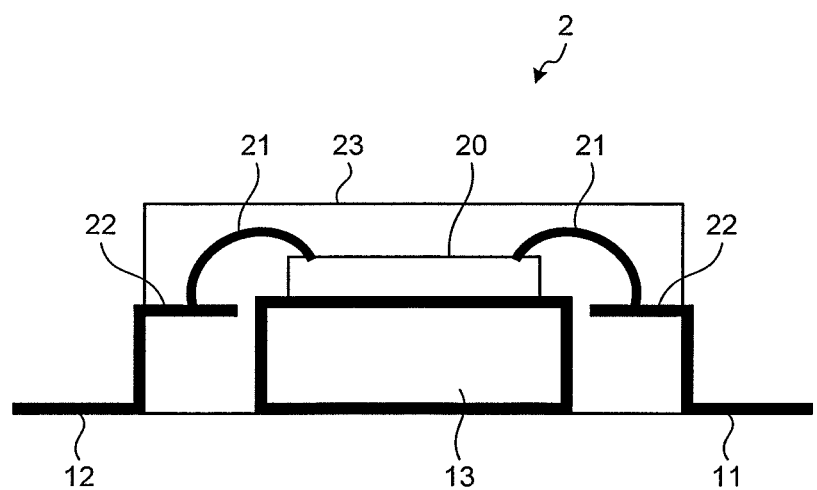
FIG. 2 is a configuration diagram of an inverter IC mounted in the power converter according to the first embodiment of the present invention.

FIG. 2 is a configuration diagram of the inverter IC 2 mounted in the power converter 60 according to the first embodiment of the present invention. In FIG. 2, an IC package 23, metal lead frames 22, bonding wires 21, the heat spreader 13, the high-voltage electrode 11, and the low-voltage electrode 12, which are components of the inverter IC 2, are shown. An IC chip 20, the bonding wires 21, and the metal lead frames 22 are covered with the IC package 23, which is high thermal conductive resin. The IC chip 20 is configured from silicon or a wide bandgap semiconductor, such as SiC. The bonding wires 21 are configured from metal wire rods of gold, copper, aluminum, or the like. One ends of the bonding wires 21 are electrically connected to the metal electrodes (aluminum wires 25 explained below) on the IC chip 20 by ultrasonic welding. The other ends of the bonding wires 21 are electrically connected to the metal lead frames 22 by the ultrasonic welding. The IC chip 20 is provided on the heat spreader 13, which is formed thick to efficiently emit heat, and is thermally and mechanically connected to the heat spreader 13 by soldering or silver paste.

In the inverter IC 2, the IC chip 20 is mounted on the heat spreader 13; therefore, transient generated heat of the heat generated from the IC chip 20 is accumulated in the heat spreader 13 and therefore transient temperature rise of the IC chip 20 is suppressed. In the inverter IC 2, the IC chip 20 and the heat spreader 13 are arranged in proximity to the metal lead frames 22. The IC chip 20 is thermally and mechanically connected to the IC package 23. Therefore, steady generated heat of the heat generated from the IC chip 20 is radiated from the high-voltage electrode 11 and the low-voltage electrode 12 to the outside of the IC chip 20 via the metal lead frames 22 and is further radiated to the outside of the IC chip 20 via the IC package 23.

(Configuration of the IC Chip 20)

Figure 3:
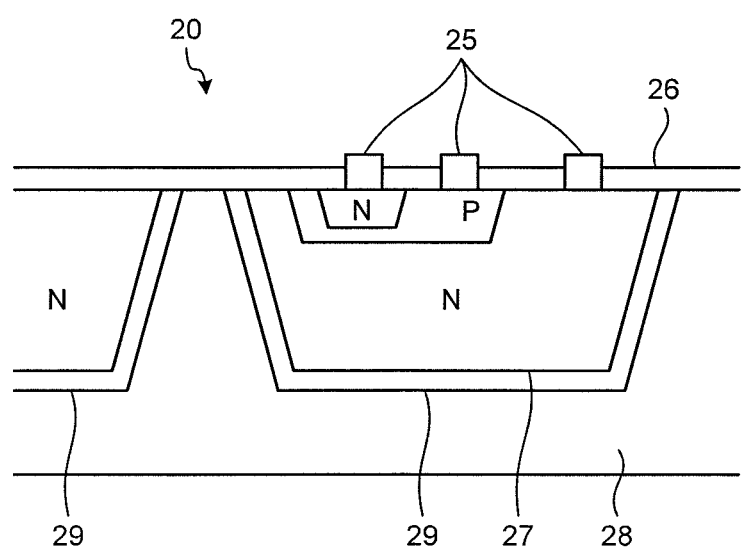
FIG. 3 is a structural diagram of an IC chip in an inverter IC of the power converter according to the first embodiment of the present invention.

FIG. 3 is a structural diagram of the IC chip 20 in the inverter IC 2 of the power converter 60 according to the first embodiment of the present invention. In the IC chip 20, a plurality of semiconductor elements configuring switching elements are provided. In the upper part of each semiconductor element, a plurality of the aluminum wires 25 for obtaining electrical connection between the semiconductor element and the external electrodes (the metal lead frames 22 shown in FIG. 2, etc.) are provided. The aluminum wires 25 are electrically connected to the metal lead frames 22 described above. On the IC chip 20, a silicon oxide film 26 having high insulation performance for providing insulation between the aluminum wires 25 is formed. Therefore, the IC chip 20 according to the first embodiment has a degree of freedom as to the arrangement of the aluminum wires 25 compared with a general IC, that is, an IC in which a plurality of semiconductor elements are respectively arranged on the metal lead frames 22 and are electrically connected to each other by the bonding wires 21. By using the IC chip 20, it is possible to provide the high-voltage electrode 11 and the low-voltage electrode 12 such that they are separated from each other in an extremely small space.

In the IC chip 20, insulating isolation layers 29 (e.g., silicon oxide) having high insulation properties are formed to electrically insulate a plurality of semiconductor single crystal islands 27 configuring semiconductor elements and a polycrystalline silicon 28 that covers the semiconductor single crystal islands 27. The polycrystalline silicon 28 is thermally and mechanically connected to the heat spreader 13 described above. The insulating isolation layers 29 are formed of, for example, silicon oxide ($SiO_2$) that can sufficiently secure insulation performance even with a thin film.

As explained above, in the IC chip 20, the semiconductor single crystal islands 27 can be arranged to be isolated from one another in an island shape on the same chip by providing the insulating isolation layers 29 having high insulation properties. Therefore, it is possible to mixedly mount switching elements that require high-voltage insulation. The IC chip 20 can be reduced in size compared with a general IC, that is, an IC in which a plurality of semiconductor elements are arranged at predetermined insulation distances and respectively mounted on the metal lead frames 22. Therefore, it is possible to reduce the size of the main body of the inverter IC 2. Further, in the IC chip 20, a low-voltage circuit can be also configured on the same chip. Therefore, a low-voltage chip for control or a chip for high and low voltage separation is unnecessary on the outside. Moreover, it is unnecessary to electrically connect the chips using the metal lead frames 22 or wires on the printed board 1. Consequently, it is possible to form the power converter circuit and the entire power converter 60 extremely small.

Figure 4:
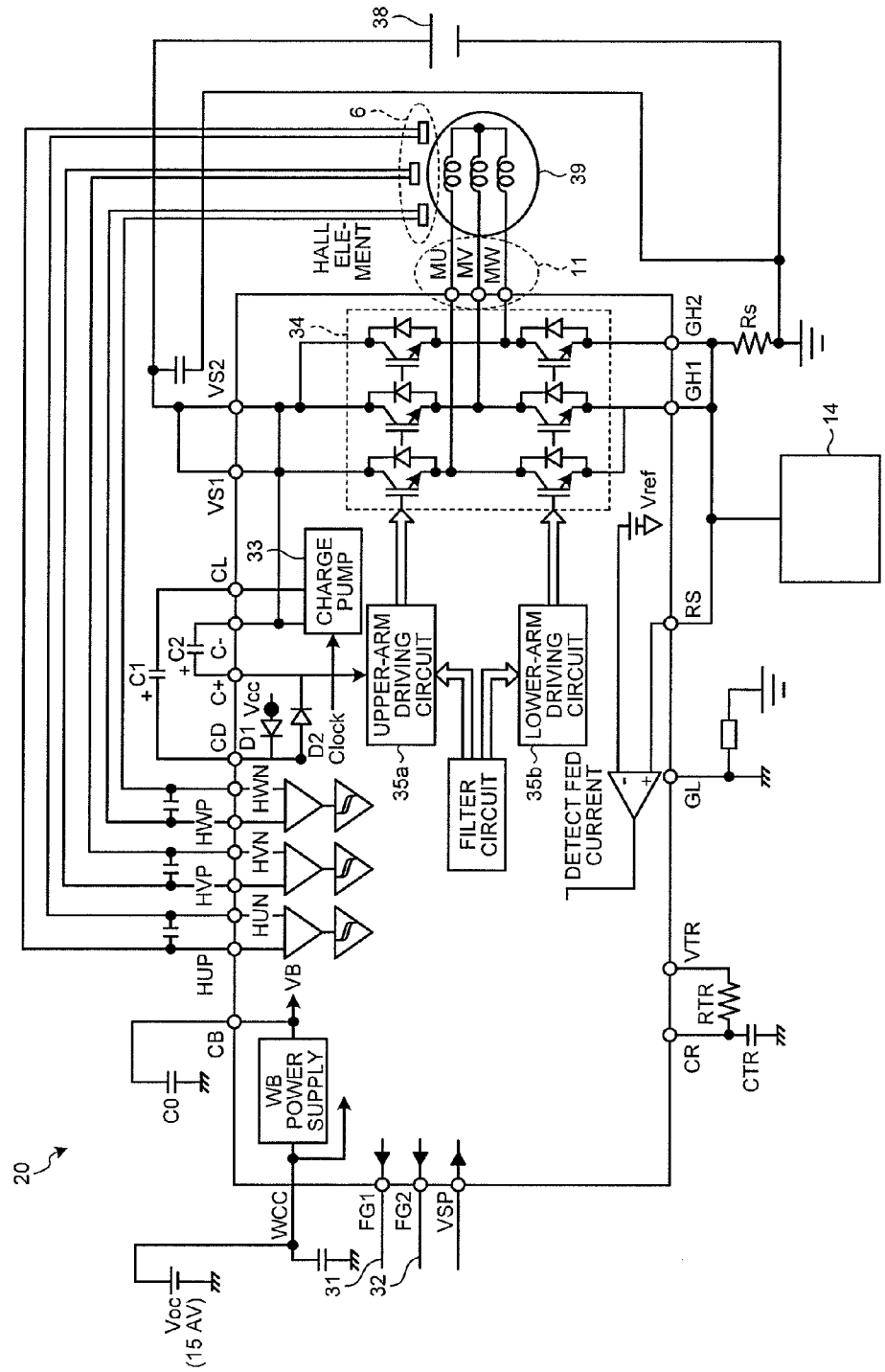
FIG. 4 is a circuit configuration diagram of the periphery of the IC chip in the inverter IC of the power converter according to the first embodiment of the present invention.

FIG. 4 is a circuit configuration diagram of the periphery of the IC chip 20 in the inverter IC of the power converter 60 according to the first embodiment of the present invention. A high-voltage direct-current power supply 38 has a high direct-current voltage obtained by subjecting the commercial power supply to full-wave rectification or double-voltage rectification on the outside of the motor 61. The voltage is input to the IC chip 20. IGBTs 34 are switching elements formed in the semiconductor single crystal islands 27 of the IC chip 20 described above. The IGBTs 34 are ON/OFF driven by an upper-arm driving circuit 35*a* and a lower-arm driving circuit 35*b* and convert an input direct-current voltage into a high-frequency voltage. Note that reflux diodes are respectively connected in anti-parallel to the six IGBTs 34 shown in FIG. 4. The high-frequency voltage from the IGBTs 34 is applied from the high-voltage electrodes 11 to the winding wires of the stator 3 via the motor terminals 5.

A rotational position signal of the rotor 16 detected by the hall elements 6 is converted into a low-voltage pulse signal by a logic circuit inside the IC chip 20 and is output to the outside from a speed output line 31. The IC chip 20 changes, on the basis of a low analog signal voltage input from the outside via the output voltage command input line 32, a switching pulse width of the six IGBTs 34 described above and adjusts the output voltage of the inverter. At this point, in the inverter configured from the six IGBTs 34, electric power of the upper-arm driving circuit 35a for driving the IGBTs 34 of the upper arm is generated by the charge pump diode 33 and the external capacitors C1 and C2. The opposite sides of the winding wires of the stator 3 connected to the motor terminals 5 (see FIG. 1) are electrically connected by a neutral point connecting wire 39 and form a star connection motor.

As the overheating detecting element 14, a positive-characteristic temperature resistance element having a steep resistance characteristic with respect to temperature is used. The overheating detecting element 14 converts detected temperature into a resistance value. The resistance value is input to an over-current protection terminal RS. The overheating detecting element 14 gives a temperature characteristic to an over-current protection level to thereby detect the overheating state of the inverter IC 2 and detects that the inverter IC 2 and the stator 3 enter the overheating state. In this case, the inverter IC 2 limits or stops an electric current supplied to the stator 3 via the high-voltage electrodes 11 and thereby prevents breakage of the inverter IC 2 and the like due to overheating.

The overheating detecting element 14 is formed of a ceramic material. Therefore, the overheating detecting element 14 cannot be provided on the IC chip 20 packaged in the thermal conductive resin. It is also conceivable to provide the overheating detecting element 14 using semiconductor on the IC chip 20. However, the element using semiconductor has a poor temperature characteristic and also has fluctuations. Therefore, when this characteristic is taken into account, a design value of the protection level has to be set low, and the output range of the motor 61 in which such a low design value is set is extremely narrow compared with the conventional configuration. Further, the inverter IC 2 according to the first embodiment is arranged on the stator side of the printed board 1. Therefore, compared with when the inverter IC 2 is arranged on the surface on the counter-stator side of the printed board 1, the inverter IC 2 easily receives heat from the stator 3, which is a heat generation source having a copper loss and an iron loss, and is disadvantageous in terms of temperature.

Therefore, the overheating detecting element 14 according to the first embodiment is arranged near the heat spreader 13 having thermally strong connection to the IGBTs 34 in the inverter IC 2. The overheating detecting element 14 is electrically and thermally connected to the low-voltage electrode 12 via the copper foils 50 explained below. The metal lead frame 22 that is the low-voltage electrode 12 is electrically and thermally connected to the IC chip 20 by the bonding wire 21 as explained above. The overheating detecting element 14 is thermally connected to the inverter IC 2 by the mold resin 4 having low thermal resistance (see FIG. 1). Because the overheating detecting element 14 is configured as explained above, the overheating detecting element 14 can accurately detect the temperature of the IGBTs 34 that cause most of the circuit loss and are most likely to be broken due to overheating.

The six IGBTs 34 configuring the inverter are arranged in an island shape while being isolated from each other by the insulating isolation layers 29 on the IC chip 20, which is the same silicon chip. The IC chip 20 has strong thermal connection to the heat spreader 13. Therefore, even when fluctuation occurs in the heat generation of the IGBTs 34 on the IC chip 20, the IGBTs 34 have substantially the same temperature because the IGBTs 34 are present on the same solid body. Thus, temperature distributions of the IGBTs 34 are smoothed.

With the configuration explained above, it is possible to avoid deterioration in temperature detection performance due to fluctuation in the temperature distributions among the IGBTs 34 configured from separate chips. Further, it is unnecessary to arrange a plurality of the overheating detecting elements 14 to detect fluctuation in temperatures in the IGBTs 34. Therefore, it is possible to reduce costs.

As explained above, due to the improvement of the temperature detection performance of the overheating detecting element 14, the inverter IC 2 can suppress a decrease of the operation range of the motor 61 caused by a rise in an ambient temperature due to the arrangement of the inverter IC 2 on the stator side on the printed board 1. In particular, in a one-chip IC such as the inverter IC 2, an ON voltage is higher (2.0 V at a 600 V withstand voltage class) than that of a single IGBT (e.g., 1.6 V in the same class) and a steady loss is large. Therefore, the effect that power reduction of the motor due to the operation range limit for prevention of breakage due to a temperature rise of the IGBTs can be covered is large.

Note that the semiconductor single crystal islands 27 configuring the IGBTs 34 can be configured from a wide bandgap semiconductor, such as GaN (gallium nitride), SiC (silicon carbide), or diamond. The wide bandgap semiconductor has high heat resistance and voltage resistance and also has high allowable current density. Therefore, it is possible to reduce the size of the IGBTs 34 formed on the IC chip 20 and attain a reduction in the size of the inverter IC 2. The power loss of the wide bandgap semiconductor is small. Therefore, it is possible to configure the IGBTs 34 such that they can operate at high efficiency.

(Arrangement Configuration of the Elements on the Printed Board 1 in the Power Converter 60)

Figure 5:
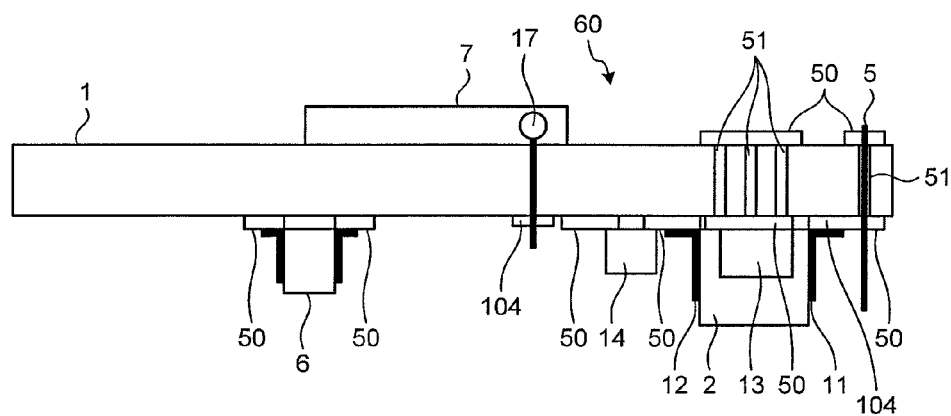
FIG. 5 is a sectional view of the power converter according to the first embodiment of the present invention.

FIG. 5 is a sectional view of the power converter 60 according to the first embodiment of the present invention. The copper foils 50 shown in FIG. 5 are formed by circuit wiring patterns on the printed board 1 or lands for electrically, thermally, and mechanically connecting the printed board 1 and the components. On the surface on the stator side of the printed board 1, the hall element 6, the overheating detecting element 14, and the inverter IC 2 are arranged via the copper foils 50. The inverter IC 2 is connected to the copper foils 50 by solder via the high-voltage electrode 11 and the low-voltage electrode 12. The overheating detecting element 14 is electrically and thermally connected to the low-voltage electrode 12 via the copper foil 50.

Through-holes 51 are holes that pierce through the printed board 1 from the surface on the stator side to the surface on the counter-stator side. Plating is applied to the surfaces of the holes. The copper foils 50 on the surface on the stator side of the printed board 1 and the copper foils 50 on the surface on the counter-stator side of the printed board 1 are electrically and thermally connected by the plating applied to the through-holes 51.

The motor terminal 5 is provided to pierce through the printed board 1 from the surface on the stator side to the surface on the counter-stator side through the through-hole 51. The motor terminal 5 is electrically connected to the copper foil 50 on the stator side via the through-hole 51 by melting string-like solder from the copper foil 50 provided on the surface on the counter-stator side of the printed board 1. The copper foil 50 on the stator side is connected to the high-voltage electrode 11 of the inverter IC 2. Therefore, the motor terminal 5 is electrically connected to the high-voltage electrode 11.

The high-voltage input line 17 is electrically connected to one end of the high-voltage direct-current input wire 104, which is provided on the surface on the stator side of the printed board 1, by solder. The other end of the high-voltage direct-current input wire 104 is electrically connected to the high-voltage electrode 11, which is provided in the inverter IC 2, by solder. On the surface on the stator side of the printed board 1, the high-voltage direct-current input wire 104 and the copper foil 50 shown around the motor terminal 5 are shown as being connected to one high-voltage electrode 11 for convenience of illustration. However, it is assumed that the high-voltage direct-current input wire 104 and the copper foil 50 are respectively connected to different high-voltage electrodes 11.

The motor external connection lead 7 electrically connects an external power supply (a high-voltage direct-current voltage, etc.) and the inverter IC 2. Therefore, the motor external connection lead 7 is mounted on the surface on the counter-stator side of the printed board 1 as a lead wire type rather than a connector type. For example, when the motor 61 is mounted on an air conditioner or the like, moisture may adhere to the outer enclosure of the motor 61. If the motor external connection lead 7 is a connector type, when moisture adheres between high and low voltage electrodes in the connector, the electrodes may be short-circuited. If the motor external connection lead 7 is a lead wire type, it is possible to avoid a short circuit and secure reliability of the motor 61.

Like the high-voltage electrode 11 and the low-voltage electrode 12, the heat spreader 13 is electrically, thermally, and mechanically connected to the copper foils 50 by solder. Further, the heat spreader 13 is thermally connected to the copper foil 50 provided on the surface on the counter-stator side of the printed board 1 via the copper foil 50 applied to the through-holes 51. The surface mount inverter IC 2 has a relatively large package size compared with the hall element 6 and the overheating detecting element 14. Thus, the inverter IC 2 receives large thermal shrinkage stress during molding and after molding of the mold resin 4 around the inverter IC 2; therefore, solder cut tends to occur. However, by mechanically strongly connecting the heat spreader 13 to the copper foil 50 by solder, the inverter IC 2 is less easily affected by the thermal shrinkage stress of the mold resin 4. Therefore, in the inverter IC 2 according to the first embodiment, the mechanical connection strength with the printed board 1 is remarkably improved and solder cut decreases compared with an IC that is connected by solder of only normal circuit electrodes (the high-voltage electrodes 11, the low-voltage electrode 12, and the like). As a result, it is possible to incorporate the power converter 60 in the motor 61 molded with the mold resin 4.

The heat spreader 13 is thermally connected to the copper foil 50 by solder on the surface on the stator side of the printed board 1 and further thermally connected to the copper foil 50 on the counter-stator side via the through-holes 51. Consequently, it is possible to radiate heat generated in the inverter IC 2 to the counter-stator side of the printed board 1.

On the surface on the stator side of the printed board 1 on which the hall element 6 is disposed, the overheating detecting element 14 and the inverter IC 2 are surface-mounted. In this way, by surface-mounting the components on the surface on the stator side of the printed board 1, the components can be electrically and mechanically connected at a time by connection (reflow soldering) by re-melting cream solder applied to the copper foils 50. Further, by surface-mounting the components on the surface on the stator side of the printed board 1, it is possible not to apply solder (prevent application of solder with a metal mask) to lands for connection of the motor external connection lead 7 and the motor terminals 5 to which solder needs to be applied after separating the printed boards 1 (explained in detail with reference to FIG. 6).

Due to the improvement of the temperature detection performance of the overheating detecting element 14, it is possible to surface-mount, on the printed board on the stator side, the inverter IC 2 including the heat spreader 13 having the largest thickness among the components mounted on the printed board 1. Consequently, room is made in the mold space on the surface on the counter-stator side of the printed board 1. Therefore, it is possible to increase the thickness of the stator 3 by the amount of the room and thereby obtain the motor 61 having a large output. Alternatively, it is possible to reduce the thickness by the amount of the room and thereby obtain the motor 61 that has the same output and is reduced in thickness.

Note that, in the example explained above, the surface mount components, such as the hall element 6, the overheating detecting element 14, and the inverter IC 2, are soldered to the printed board 1 by reflow soldering. However, the surface mount components can be mounted by flow soldering (a method of feeding the printed board 1 on a solder bath and applying solder to joining sections of the components and the substrate).

(Cut-Out of the Printed Board 1 from the Material)

Figure 6:
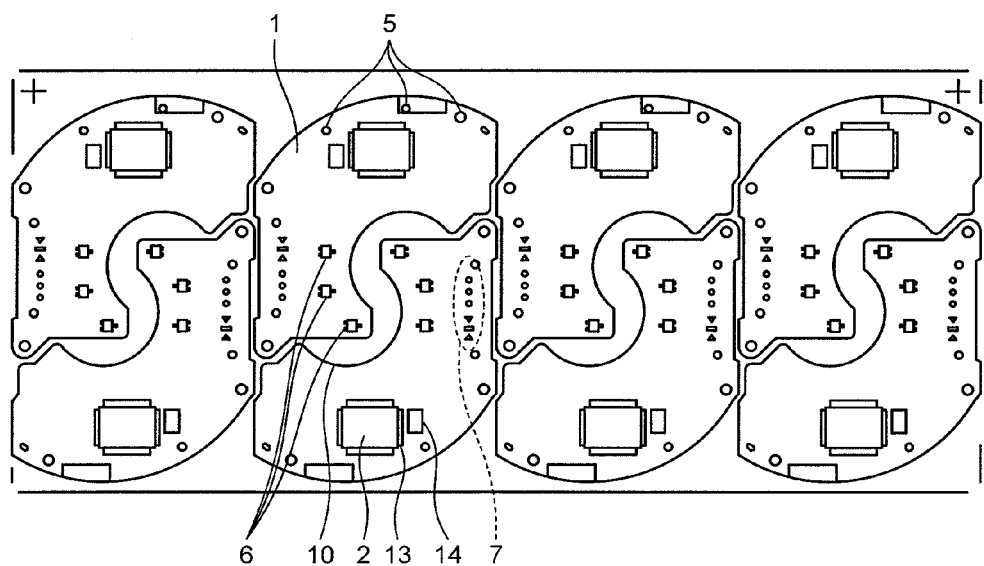
FIG. 6 is a diagram for explaining an advantage in cutting out a plurality of printed boards according to the first embodiment of the present invention from one substrate.

FIG. 6 is a diagram for explaining an advantage in cutting out a plurality of the printed boards 1 according to the first embodiment of the present invention from one substrate. In FIG. 6, an example is shown in which the printed boards 1 according to the first embodiment are molded on one substrate.

The package of the printed board 1 according to the first embodiment is reduced in size by not mounting the neutral point connecting wire 39 (see FIG. 4) of the stator 3 and by using the inverter IC 2 in which a plurality of high-voltage elements are integrated on the IC chip 20, which is a one-chip semiconductor. Consequently, it is possible to form the printed board 1 having a semi-circular arc shape, the cross sectional area of which is a half or less. In this case, the inner diameter section of the printed board 1 is formed in a semi-circular arc shape so that a bearing (not shown) can be provided.

The conventional printed board is formed in an annular shape. Therefore, components such as the inverter IC 2 cannot be disposed in the inner circumferential section (a section equivalent to the bearing diameter) of the printed board. Therefore, the inner circumferential section of the printed board is discarded. In contrast, in the printed board 1 according to the first embodiment, the inner diameter section of the printed board 1 is formed in a semi-circular arc shape. Therefore, when a plurality of the printed boards 1 are molded on one substrate, by opposing the inner diameter sections of the printed boards 1 and arranging the arc centers of the inner diameter sections to be offset from each other, it is possible to effectively utilize the inner diameter sections of the printed boards 1. In other words, it is possible to mold the printed boards 1 on one substrate at high density.

Therefore, it is possible to improve efficiency of the use of the substrate for molding the printed boards 1.

In the conventional printed board, the inner circumferential section of the printed board is formed in an annular shape. Therefore, when an electronic component is connected to the printed board using flow soldering, solder in a solder bath comes up through this through-section. To prevent the solder from coming up, a process of providing a plate for closing the through-section is necessary before a flow soldering process. Moreover, a process of removing the plate is necessary after the soldering process. In contrast, the printed board 1 according to the first embodiment includes the semi-circular-arc-shaped inner diameter section rather than an annular inner circumferential section. Therefore, when an electronic component is soldered by flow soldering, it is possible to eliminate the processes described above and thus the printed boards 1 can be manufactured at low cost.

In the printed board 1 according to the first embodiment, the heat spreader 13 disposed on the back of the inverter IC 2 (i.e., between the inverter IC 2 and the printed board 1) is connected to the copper foil 50 and the overheating detecting element 14 is disposed near the heat spreader 13. Therefore, various effects explained above can be obtained. However, when the printed board 1 is configured as above, another printed board copper foil for wiring (e.g., the high-voltage direct-current input wire 104 shown in FIG. 1) cannot be arranged between the inverter IC 2 and the printed board 1 or around the inverter IC 2. Therefore, it is necessary to route the high-voltage direct-current input wire 104 on the surface on the counter-stator side of the printed board 1. However, because the die holes for holding the substrate (see reference numeral 100 in FIG. 1) are arranged in the surface on the counter-stator side of the printed board 1, an area where the high-voltage direct-current input wire 104 can be wired is extremely narrow. Therefore, the high-voltage direct-current input wire 104 cannot be realized on the printed board 1 on which the copper foils 50 are present only on the counter-stator side. Thus, even when the copper foils 50 are present on the counter-stator side a little, the high-voltage direct-current input wire 104 cannot be realized by the little copper foils 50.

On the other hand, when the inverter IC 2 enters a vertical short-circuit state at the time of abnormality, such as different voltage input, in general, the bonding wires 21 (see FIG. 2), which are the thinnest conductors on the high voltage side of the direct-current power supply wire, undergoes melt fracture by a temperature rise due to the short-circuit current. The IC chip 20 and the metal lead frames 22 near the bonding wires 21 also undergoes melt fracture by heat generation during melting. With the surface-mount component package in the printed board 1 according to the first embodiment, because the metal lead frames 22 of the inverter IC 2 are short compared with the conventional lead type, melt fracture also affects the copper foils 50 via the low-voltage electrode 12 and the high-voltage electrodes 11.

In the printed board 1 according to the first embodiment, a wiring space is provided on the surface on the stator side of the printed board 1 by diverting the motor output wire 105 (see FIG. 1) extended from the high-voltage electrode 11 to the counter-stator side and the high-voltage direct-current input wire 104 is provided in the wiring space. Therefore, compared with the case where the high-voltage direct-current input wire 104 is routed on the surface on the counter-stator side of the printed board 1, a long distance can be secured between the metal holes (100) and the high-voltage direct-current input wire 104. Therefore, it is possible to reduce the resin thickness (the thickness of the mold resin 4) for suppressing the influence when the high-voltage direct-current input wire 104 is melted. As a result, it is possible to attain a reduction in the weight and size of the motor 61. The influence when the high-voltage direct-current input wire 104 is melted means that, for example, sound and light caused by a short-circuit current occur on the counter-stator side of the printed board 1, which makes the user feel uneasy.

Note that it goes without saying that the same effects can be obtained even when the metal holes (100) are closed after being molded. However, with the printed board 1 according to the first embodiment, it is possible to omit a process of closing the holes. With the printed board 1 according to the first embodiment, even when a machining method in which the metal holes (100) are not left is used, a large distance can be secured between the high-voltage direct-current input wire 104 and the outer enclosure of the mold resin 4. Therefore, the thickness of the resin provided on the counter-stator side of the printed board 1 is reduced. Accordingly, it is possible to reduce the thickness of the motor itself.

Effects of the First Embodiment

In the inverter IC 2 according to the first embodiment, the IC chip 20 is mounted on the heat spreader 13; therefore, transient generated heat of the heat generated from the IC chip 20 is accumulated in the heat spreader 13 and therefore transient temperature rise of the IC chip 20 is suppressed.

In the inverter IC 2, the IC chip 20 and the heat spreader 13 are arranged in proximity to the metal lead frames 22. Further, the IC chip 20 is thermally and mechanically connected to the IC package 23. Therefore, steady generated heat of the heat generated from the IC chip 20 is radiated from the high-voltage electrodes 11 and the low-voltage electrode 12 to the outside of the IC chip 20 via the metal lead frames 22 and is further radiated to the outside of the IC chip 20 via the IC package 23.

In the IC chip 20 according to the first embodiment, the semiconductor single crystal islands 27 can be arranged to be isolated from one another in an island shape on the same chip by providing the insulating isolation layers 29 having high insulation properties. Therefore, it is possible to mixedly mount switching elements that require high-voltage insulation.

The IC chip 20 can be reduced in size compared with a general IC, that is, an IC in which a plurality of semiconductor elements are arranged at predetermined insulation distances and respectively mounted on the metal lead frames 22. Therefore, it is possible to reduce the size of the main body of the inverter IC 2.

In the IC chip 20, a low-voltage circuit can be also configured on the same chip. Therefore, a low-voltage chip for control or a chip for high and low voltage separation is unnecessary on the outside. Moreover, it is unnecessary to electrically connect the chips using the metal lead frames or the like. Consequently, it is possible to form the power converter circuit and the entire power converter 60 extremely small.

In the IC chip 20, compare with a general IC, that is, an IC in which a plurality of semiconductor elements are respectively arranged on the metal lead frames 22 and are electrically connected to each other by the bonding wires 21, it is possible to give a degree of freedom as to the arrangement of the aluminum wires 25. By using the IC chip 20, it is possible to provide the high-voltage electrodes 11 and the low-voltage electrode 12 such that they are separated from each other in an extremely small space.

The overheating detecting element 14 according to the first embodiment is arranged near the heat spreader 13 having thermally strong connection to the IGBTs 34 in the inverter IC 2. The overheating detecting element 14 is electrically and thermally connected to the low-voltage electrode 12 via the copper foils 50. Therefore, the overheating detecting element 14 can accurately detect the temperature of the IGBTs 34.

Due to the improvement of the temperature detection performance of the overheating detecting element 14, the inverter IC 2 can suppress a decrease of the operation range of the motor 61 caused by a temperature rise due to the arrangement of the inverter IC 2 on the stator side on the printed board 1.

The six IGBTs 34 configuring the inverter are arranged in an island shape while being isolated from each other by the insulating isolation layers 29 on the IC chip 20, which is the same silicon chip. Further, the IC chip 20 has strong thermal connection to the heat spreader 13. Therefore, even when fluctuation occurs in the heat generation of the IGBTs 34 on the IC chip 20, the IGBTs 34 have substantially the same temperature because the IGBTs 34 are present on the same solid body. Thus, temperature distributions of the IGBTs 34 are smoothed.

With the configuration explained above, it is possible to avoid deterioration in temperature detection performance due to fluctuation in the temperature distributions among the IGBTs 34 configured from separate chips.

Further, it is unnecessary to arrange a plurality of the overheating detecting elements 14 to detect fluctuation in temperatures in the IGBTs 34. Therefore, it is possible to reduce costs.

The motor external connection lead 7 is mounted on the surface on the counter-stator side of the printed board 1 as a lead wire type. Therefore, it is possible to avoid a short circuit between the high and low voltage electrodes when moisture adheres to the outer enclosure of the motor 61. Thus, it is possible to secure reliability of the motor 61.

In the inverter IC 2, the heat spreader 13 is mechanically strongly connected to the copper foil 50. Therefore, compared with connection by solder of only the normal circuit electrodes, the mechanical connection strength with the printed board 1 can be remarkably improved. Consequently, it is possible to incorporate the power converter 60 in the motor 61 molded with the mold resin 4.

The heat spreader 13 is thermally connected to the copper foil 50 by solder on the surface on the stator side of the printed board 1 and further thermally connected to the copper foil 50 on the counter-stator side via the through-holes 51. Consequently, it is possible to radiate heat generated in the inverter IC 2 to the counter-stator side of the printed board 1.

By arranging the inverter IC 2 on the surface on the stator side of the printed board 1, the heat spreader 13 is arranged at a position distant from the bearing 9. Therefore, it is possible to obtain the motor 61 in which an electrolytic corrosion phenomenon occurs less easily.

By surface-mounting the components on the surface on the stator side of the printed board 1, the components can be electrically and mechanically connected at a time using reflow soldering. By surface-mounting the components on the surface on the stator side of the printed board 1, it is possible, with the use of a metal mask, not to apply solder to lands for connection of the motor external connection lead 7 and the motor terminals 5 to which solder needs to be applied after separating the printed board 1. There is an advantage that, during re-melting of solder, the through-holes 51 are not filled with the solder; therefore, additional processes of applying a masking tape and removing a masking tape for preventing the through-holes 51 from being filled with the solder can be eliminated. In this way, by surface-mounting the components on the surface on the stator side of the printed board 1, work for soldering semiconductor elements and the like onto the substrate is simplified. Therefore, it is possible to reduce machining costs and it is possible to remarkably improve the mechanical connection strength of the substrate and the semiconductor elements and the like.

Due to the improvement of the temperature detection performance of the overheating detecting element 14, it is possible to surface-mount the inverter IC 2 including the heat spreader 13 on the surface on the stator side of the printed board 1. Consequently, room is made in the mold space on the surface on the counter-stator side of the printed board 1. Therefore, it is possible to increase the thickness of the stator 3 by the amount of the room and thereby obtain the motor 61 having a large output. Alternatively, it is possible to reduce the thickness by the amount of the room and thereby obtain the motor 61 that has the same output and is reduced in thickness.

The package of the printed board 1 according to the first embodiment is reduced in size by not mounting the neutral point connecting wire 39 (see FIG. 4) of the stator 3 and by using the inverter IC 2 in which a plurality of high-voltage elements are integrated on the IC chip 20, which is a one-chip semiconductor. Consequently, it is possible to form the printed board 1 having a semi-circular arc shape, the cross sectional area of which is a half or less.

The inner diameter section of the printed board 1 is formed in a semi-circular arc shape. Therefore, when a plurality of the printed boards 1 are molded on one substrate, by opposing the inner diameter sections of the printed boards 1 and arranging the arc centers of the inner diameter sections to be offset from each other, it is possible to improve efficiency of the use of the substrate for molding the printed board 1.

The motor 61 according to the first embodiment is the motor 61 incorporating the power converter 60 including the printed board 1 on which a semiconductor module (the inverter IC 2) is mounted. The power converter 60 converts the voltage of the external power supply into a high-frequency voltage and supplies the high-frequency voltage to the stator 3. On the surface of the printed board 1 opposed to the stator 3, the high-voltage direct-current input wire 104 is disposed, one end of which is electrically connected to the high-voltage input line 17 of the external power supply and the other end of which is electrically connected to the high-voltage electrode 11 of the inverter IC 2. Therefore, compared with the case where the high-voltage direct-current input wire 104 is routed on the surface on the counter-stator side of the printed board 1, a long distance can be secured between the metal holes (100) and the high-voltage direct-current input wire 104. Therefore, it is possible to reduce the resin thickness (the thickness of the mold resin 4) for suppressing the influence when the high-voltage direct-current input wire 104 is melted. As a result, it is possible to attain a reduction in the weight and size of the motor 61.

Second Embodiment (Configuration of an Air Conditioner 200)

Figure 7:
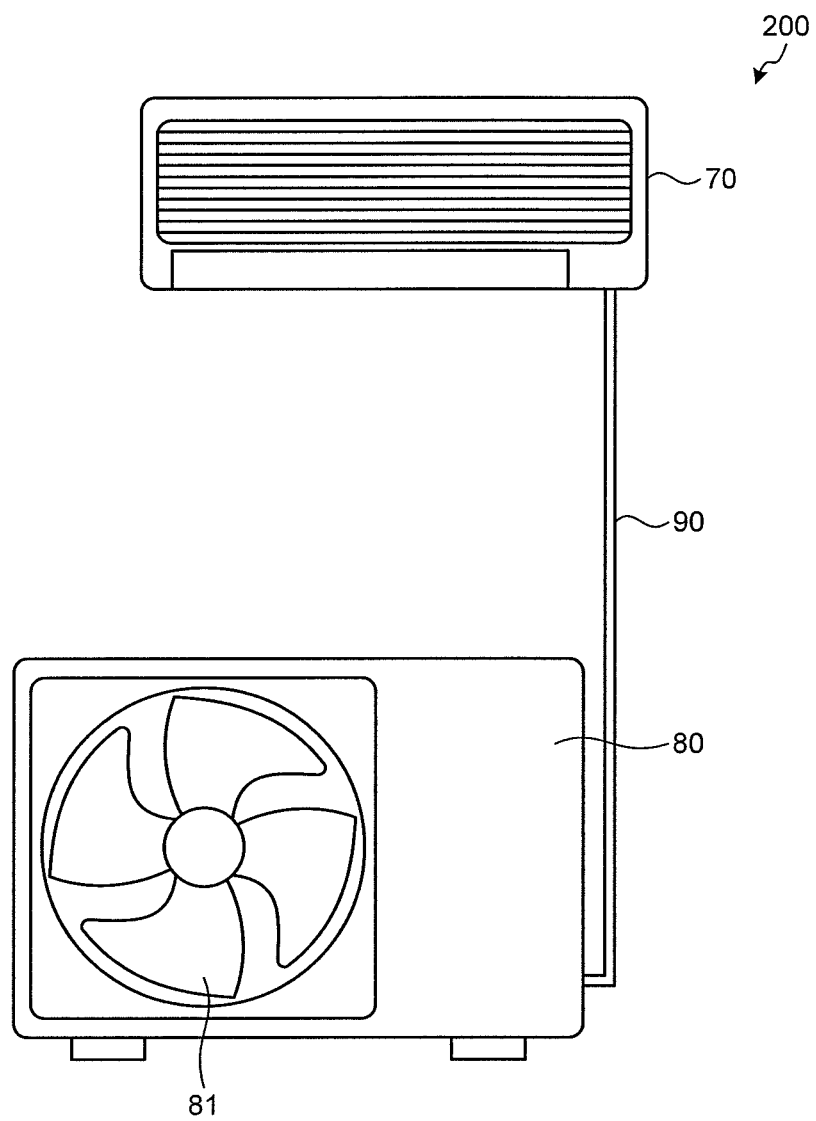
FIG. 7 is an overall external view of an air conditioner according to a second embodiment of the present invention.
Figure 8:
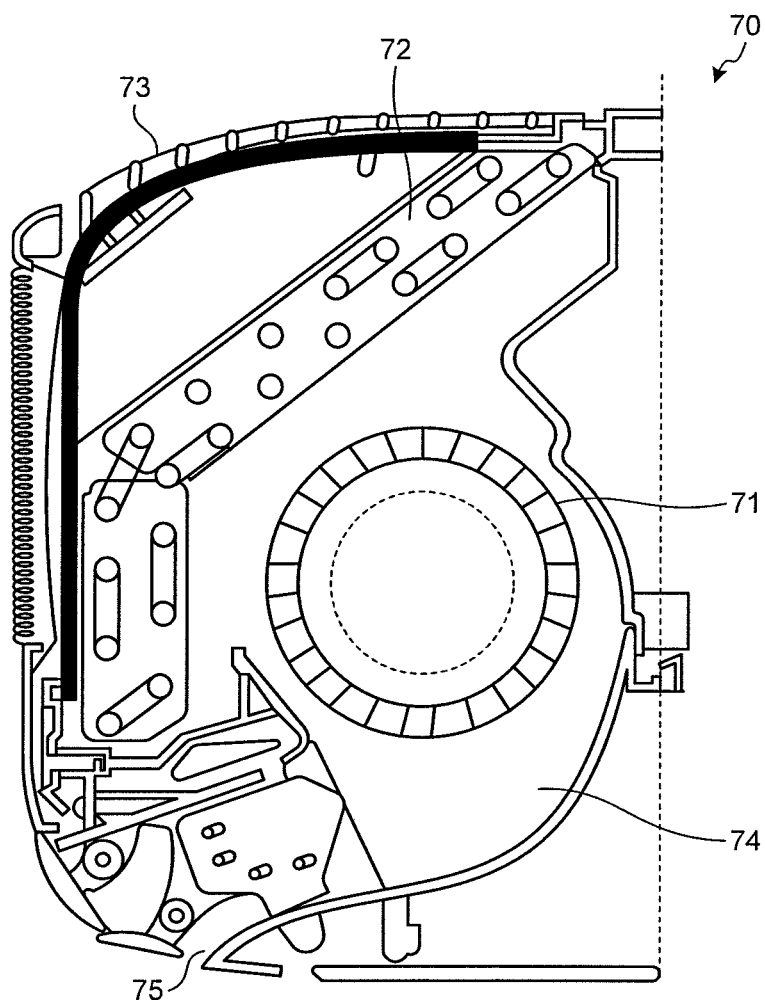
FIG. 8 is a transverse sectional view of an indoor unit in the air conditioner according to the second embodiment of the present invention.

FIG. 7 is an overall external view of the air conditioner 200 according to a second embodiment of the present invention. FIG. 8 is a transverse sectional view of an indoor unit 70 in the air conditioner 200.

In the air conditioner 200 shown in FIG. 7, the indoor unit 70 hung on a wall in a room is connected to an outdoor unit 80 installed outdoors via a refrigerant pipe 90. An indoor blower 71 explained below is incorporated in the indoor unit 70. An outdoor blower 81 is arranged in the outdoor unit 80.

In FIG. 8, the indoor unit 70 includes, as main components, an inlet port 73 provided on the upper surface of the indoor unit 70, an indoor heat exchanger 72, the indoor blower 71, a blown air path 74, and an outlet port 75. The indoor heat exchanger 72 exchanges heat between the indoor air and a refrigerant. The indoor blower 71 sucks indoor air from the inlet port 73, changes the air into heat-exchanged conditioned air by causing the air to pass through the indoor heat exchanger 72, and then blows the conditioned air into the room. The indoor heat exchanger 72 is arranged such that it extends from the back upper part to near the front middle stage of the indoor unit 70 and is bent from near the front middle stage to the front lower part to surround the front side of the indoor blower 71. The indoor blower 71 is a line flow fan rotatably provided in a form extending in the longitudinal direction of the indoor unit 70. The motor 61 (see FIG. 1) incorporating the power converter 60 according to the first embodiment is coupled to the end in the longitudinal direction of the indoor blower 71 to rotationally drive the indoor blower 71. The blown air path 74, through which the conditioned air circulates, is formed below the indoor blower 71. The outlet port 75 is provided in the lower part of the indoor unit 70 to discharge the conditioned air circulated through the blown air path 74 to the outside.

(Basic Operation of the Indoor Unit 70 of the Air Conditioner 200)

A basic operation of the indoor unit 70 is explained next. When a user operates a remote controller or the like to start the operation of the air conditioner 200, the motor 61 coupled to the indoor blower 71 is rotationally driven. The indoor blower 71 is rotationally driven in conjunction with the rotation of the motor 61. The indoor air is sucked from the inlet port 73 according to the rotation of the indoor blower 71. The sucked indoor air further passes through the indoor heat exchanger 72 according to the continuous rotation of the indoor blower 71 and exchanges heat with the refrigerant circulating through the inside of the indoor heat exchanger 72. The indoor heat exchanger 72 functions as an evaporator when the air conditioner 200 is carrying out a cooling operation. Because the refrigerant inside the indoor heat exchanger 72 evaporates, the indoor air passing through the indoor heat exchanger 72 is cooled. On the other hand, when the air conditioner 200 is carrying out a heating operation, the indoor heat exchanger 72 functions as a condenser. The indoor air passing through the indoor heat exchanger 72 is heated. In this way, when the indoor air sucked into the indoor unit 70 passes through the indoor heat exchanger 72, the indoor air exchanges heat in the indoor heat exchanger 72 and is changed into conditioned air requested by the user. The conditioned air passed through the indoor heat exchanger 72 passes through the blown air path 74 and is blown into the room from the outlet port 75 according to the continuous rotation of the indoor blower 71. The air volume of the blown conditioned air is adjusted by changing the speed of the motor 61 coupled to the indoor blower 71.

Effects of the Second Embodiment

As explained above, in the air conditioner 200 according to the second embodiment, the motor 61 incorporating the power converter 60 according to the first embodiment is mounted on the indoor blower 71. Therefore, it is possible to increase the size of the indoor heat exchanger 72 by the amount of reduction in the size of the motor 61. In the air conditioner 200 according to the second embodiment, resin for suppressing an influence on the outside of the motor during an abnormality such as different voltage input is reduced in thickness. Therefore, reduction in both size and weight can be achieved, energy saving performance is high, and it is possible to make the user feel less uneasy when an abnormality occurs.

In the air conditioner 200 according to the second embodiment, when the motor 61 according to the first embodiment increased in an output is mounted (i.e., when the motor 61 including the stator 3 increased in thickness by the amount of the room in the mold space on the surface on the counter-stator side of the printed board 1 is mounted), it is possible to secure high heat exchange performance at the time of start-up, the air conditioner 200 reaches a set temperature in a short time, and it is possible to improve the comfort of the user. Wind speed can be increased by the increase in the output of the motor 61. Therefore, it is possible to eliminate temperature variation in the room. Accordingly, it is possible to further improve the comfort of the user and, at the same time, it is possible to make the user feel less uneasy when an abnormality occurs.

Note that the configuration of the air conditioner 200, in particular, the indoor unit 70 shown in FIG. 7 and FIG. 8 explained above is an example. The configuration is not limited by the example. In an example explained in the second embodiment, the motor 61 according to the first embodiment is used for the indoor blower 71 of the indoor unit 70. However, the air conditioner 200 according to the second embodiment is not limited to the example and can be configured such that the motor 61 is used for the outdoor blower 81 of the outdoor unit 80.

The power converter 60 according to the first embodiment uses the high-voltage direct-current voltage subjected to the full-wave rectification or the double-voltage rectification as the high-voltage direct-current power supply 38. Therefore, breaking energy of a wire and the periphery of the wire during a short-circuit failure of a Si or SiC element chip is an order of magnitude greater than a case where a motor incorporating a circuit in which a low-voltage power supply of 30 volts or less using a step-down power supply is used. When a resistance value of a high-voltage wiring system during the short-circuit failure is represented by R and a direct-current power supply voltage is represented by V, the amount of heat generation during breakage is represented by $V^2/R$. The resistance during the short-circuit failure tends to be smaller in a high-voltage power element having a large chip sectional area. Even if the resistance is the same, the power supply voltage has a difference of 5 to 10 times or more and the breaking energy is 25 to 100 times or more. As a result, an influence on the outside of the motor and the apparatus tends to occur; therefore, the user tends to feel uneasy. Therefore, first, it is requested not to cause breakage. Even if element destruction occurs, a more secure apparatus is obtained if the user present outside the apparatus does not recognize the influence of the element destruction. On the printed board 1 according to the first embodiment, as explained above, the high-voltage direct-current input wire 104 is provided on the surface on the stator side of the printed board 1. Therefore, compared with the case where the high-voltage direct-current input wire 104 is routed on the surface on the counter-stator side of the printed board 1, a long distance can be secured between the metal holes (100)

and the high-voltage direct-current input wire 104. Thus, in the air conditioner 200 on which the motor 61 according to the first embodiment is mounted, sound and light caused by a short-circuit current do not occur on the counter-stator side of the printed board 1; therefore, it is possible to make the user feel less uneasy when an abnormality occurs.

In the embodiments explained above, the one-chip inverter IC 2 is used in the main circuit of the inverter. However, it goes without saying that the same effects can be obtained even when a multi-chip inverter IC 2 of a high-voltage surface-mounting type and a discrete main element are used.

Examples of a wide bandgap semiconductor include silicon carbide, a gallium nitride material, and diamond. A switching element and a diode element configured from such a wide bandgap semiconductor have high voltage resistance and high allowable current density. Therefore, the switching element and the diode element can be reduced in size. By using the switching element and the diode element reduced in size, it is possible to reduce the size of a semiconductor module incorporating the elements. In the elements, ON resistance during a vertical short circuit is lower than that in a narrow-gap Si semiconductor and therefore a short-circuit current flows more. Thus, the degree of damage to the wire and the periphery of the wire is large. Accordingly, the effect obtained by arranging the high-voltage direct-current input wire on the stator surface is higher.

The wide bandgap semiconductor also has high heat resistance. Therefore, the heat spreader 13 can be reduced in size. For example, a cooling system can be changed from water cooling to air cooling. Therefore, it is possible to further reduce the semiconductor module in size. Therefore, the metal lead frames 22 are short compared with the case of a Si element. Thus, the degree of damage to the wire and the periphery of the wire is large. Accordingly, the effect obtained by arranging the high-voltage direct-current input wire 104 on the stator surface is high.

Note that it is desirable that both the switching element and the diode element are configured from a wide bandgap semiconductor. However, any one of the elements can be configured from a wide bandgap semiconductor and the effects described in the embodiments can be obtained.

In the explanation in the first and second embodiments, the thermal, electrical, and mechanical connection of the elements and the metals is performed by solder. However, it goes without saying that the same effects can be obtained even if materials such as other metal and conductive resin are used.

In the first and second embodiments, the double-sided through-hole substrate using the copper foils 50 is used as the printed board 1. However, it goes without saying that, even if a base material formed of other metal or an insulating material or a substrate on which a circuit is not formed by etching or the like is used, the same effects can be obtained as long as wiring is possible on both the surfaces.

In the first and second embodiments, the air conditioner is explained as an apparatus on which the motor is mounted. However, the motor 61 can be used in a ventilation blower. For example, it goes without saying that the same effects described above such as a reduction in the thickness of the apparatus and improvement of blowing performance can be obtained by using the motor 61 as a motor of the ventilation blower that blows the indoor air to the outside of the room. Improvement of the blowing performance is particularly effective, for example, when it is desired to discharge moisture and an odor in a short time in a bathroom, a toilet, and the like.

In the embodiments, the air conditioner is explained as an apparatus on which the motor is mounted. However, the motor 61 can be used in a water heater. For example, it goes without saying that the same effects described above such as a reduction in the thickness of the apparatus and improvement of blowing performance can be obtained by using the motor 61 in a blower in the water heater or a fluid pump in the water heater for heating water using a refrigerant. Improvement of high-temperature high-load performance is particularly effective when hot water having high temperature, which causes a rise in motor peripheral temperature, is pumped.

INDUSTRIAL APPLICABILITY

As explained above, the present invention can be mainly applied to the motor incorporating the power converter, and the air conditioner, the water heater, and the ventilation blower incorporating the motor. In particular, the present invention is useful as an invention that can attain a reduction in the size of the printed board and can reduce the thickness of the mold resin on the counter-stator side.

The invention claimed is:

1. A motor comprising:
a stator; and
a power converter that includes
a substrate on which a semiconductor module that converts a voltage of an external power supply into a high-frequency voltage and that supplies the high-frequency voltage to the stator is mounted, the semiconductor module being disposed on a surface of the substrate facing the stator, and
a high-voltage side wire disposed on the surface of the substrate facing the stator, the high-voltage side wire including a first end electrically connected to a high-voltage input line of the external power supply and a second end electrically connected to a high-voltage electrode of the semiconductor module, wherein
the substrate and the stator are mechanically connected by mold resin, and
a plurality of holes are formed through the mold resin on a side of a surface of the substrate that is opposite to the surface facing the stator so that the substrate is directly exposed from the hole to correctly keep the positional relationship between the stator and a printed board molded on the substrate, and
the high-voltage side wire is disposed on the surface of the substrate facing the stator so that the high-voltage side wire and the plurality of holes are disposed on opposite surfaces of the substrate and a distance between the plurality of holes and the high-voltage side wire is secured.

2. The motor incorporating the power converter according to claim 1, wherein
the semiconductor module includes a semiconductor chip in which a plurality of semiconductor elements are formed, and
the semiconductor chip is electrically connected to an external electrode of the semiconductor module by a metal wire.

3. The motor according to claim 2, wherein the semiconductor module includes a heat spreader that is arranged on the substrate and is arranged near the external electrode of the semiconductor module.

4. The motor according to claim 2, wherein the semiconductor chip is configured from a wide bandgap semiconductor.

5. An air conditioner comprising:
an indoor unit that blows conditioned air into an installation room;
an indoor blower that is arranged in the indoor unit and sends the conditioned air from an outlet port of the indoor unit; and
an outdoor unit that is connected to the indoor unit by a refrigerant pipe and exchanges heat with outdoor air, wherein
the motor incorporating the power converter according to claim 1 is provided in the indoor blower.

6. An air conditioner comprising:
an indoor unit that blows conditioned air into an installation room;
an outdoor unit that is connected to the indoor unit by a refrigerant pipe and exchanges heat with outdoor air; and
an outdoor blower that is arranged in the outdoor unit and sends outdoor air into the outdoor unit, wherein
the motor incorporating the power converter according to claim 1 is provided in the outdoor blower.

7. A water heater, wherein the motor incorporating the power converter according to claim 1 is provided in a blower for heating water using a refrigerant.

8. A water heater, wherein the motor incorporating the power converter according to claim 1 is provided in a fluid pump for heating water using a refrigerant.

9. A ventilation blower that blows indoor air to an outside of a room, wherein the motor incorporating the power converter according to claim 1 is provided.

10. The motor according to claim 1, wherein
the resin is a thermosetting mold resin, and
the hole is a die hole made by a die that holds the opposite surface of the substrate.

11. The motor according to claim 1, wherein the high-voltage side wire is entirely disposed on the surface of the substrate facing the stator.

12. The motor according to claim 3, wherein the heat spreader is attached to the surface of the substrate facing the stator.

13. The motor according to claim 1, wherein the substrate of the power converter has a semicircular shape that includes two arc-shaped peripheral edges.

* * * * *